US012389613B2

(12) United States Patent
Wang et al.

(10) Patent No.: US 12,389,613 B2
(45) Date of Patent: Aug. 12, 2025

(54) SEMICONDUCTOR STRUCTURE

(71) Applicant: Powerchip Semiconductor Manufacturing Corporation, Hsinchu (TW)

(72) Inventors: Wei-Lin Wang, Taichung (TW); Michio Sakurai, Hsinchu (TW); Cheng Yu Tsai, Hsinchu County (TW); Shou-Zen Chang, Hsinchu (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 407 days.

(21) Appl. No.: 18/183,165

(22) Filed: Mar. 14, 2023

(65) Prior Publication Data

US 2024/0274652 A1 Aug. 15, 2024

(30) Foreign Application Priority Data

Feb. 13, 2023 (TW) .................................. 112105057

(51) Int. Cl.
*H10D 1/68* (2025.01)
*H01G 4/018* (2006.01)
*H01L 23/522* (2006.01)

(52) U.S. Cl.
CPC ............. *H10D 1/696* (2025.01); *H01G 4/018* (2013.01); *H01L 23/5223* (2013.01)

(58) Field of Classification Search
CPC .......... H10D 1/68; H10D 1/692; H10D 1/696; H10D 1/714; H10D 64/20; H01L 23/5223; H01L 23/5222; H01L 23/642; H01G 4/38; H01G 4/005
See application file for complete search history.

(56) References Cited

U.S. PATENT DOCUMENTS

| 6,777,777 | B1 | 8/2004 | Kar-Roy et al. |
| 2005/0121744 | A1 | 6/2005 | Chang et al. |
| 2020/0035779 | A1* | 1/2020 | Huang .............. H01L 21/31116 |

FOREIGN PATENT DOCUMENTS

| TW | 201330226 | 7/2013 |
| TW | I696285 | 6/2020 |

OTHER PUBLICATIONS

"Notice of allowance of Taiwan Counterpart Application", issued on Jul. 31, 2023, p. 1-p. 4.

* cited by examiner

*Primary Examiner* — Thanhha S Pham
(74) *Attorney, Agent, or Firm* — JCIPRNET

(57) ABSTRACT

A semiconductor structure including the following components is provided. A first capacitor structure includes first, second, and third electrode layers and first and second dielectric layers. The second electrode layer is disposed on the first electrode layer. The top-view pattern of the second electrode layer partially overlaps the top-view pattern of the first electrode layer to have a first overlapping region. The third electrode layer is disposed on the second electrode layer. The top-view pattern of the third electrode layer partially overlaps the top-view pattern of the second electrode layer to have a second overlapping region. The first overlapping region and the second overlapping region have the same top-view area. The first dielectric layer is disposed between the first electrode layer and the second electrode layer. The second dielectric layer is disposed between the second electrode layer and the third electrode layer.

20 Claims, 11 Drawing Sheets

SEMICONDUCTOR STRUCTURE

CROSS-REFERENCE TO RELATED APPLICATION

This application claims the priority benefit of Taiwan application serial no. 112105057, filed on Feb. 13, 2023. The entirety of the above-mentioned patent application is hereby incorporated by reference herein and made a part of this specification.

BACKGROUND

Technical Field

The invention relates to a semiconductor structure, and particularly relates to a semiconductor structure including a capacitor structure.

Description of Related Art

The capacitor is a device widely used in the semiconductor structure. The current capacitor structure may include stacked electrode layers to form multiple capacitors. Therefore, the capacitance of the capacitor structure can be increased. However, since multiple capacitors in the capacitor structure have different capacitances, the design complexity of the capacitor structure will be increased.

SUMMARY

The invention provides a semiconductor structure, which can increase the capacitance and is easier to design.

The invention provides a semiconductor structure, which includes a substrate, a first capacitor structure, a first contact structure, and a second contact structure. The first capacitor structure is disposed above the substrate. The first capacitor structure includes a first electrode layer, a second electrode layer, a third electrode layer, a first dielectric layer, and a second dielectric layer. The second electrode layer is disposed on the first electrode layer. The top-view pattern of the second electrode layer partially overlaps the top-view pattern of the first electrode layer to have a first overlapping region. The third electrode layer is disposed on the second electrode layer. The top-view pattern of the third electrode layer partially overlaps the top-view pattern of the second electrode layer to have a second overlapping region. The first overlapping region and the second overlapping region have the same top-view area. The first dielectric layer is disposed between the first electrode layer and the second electrode layer. The second dielectric layer is disposed between the second electrode layer and the third electrode layer. The first contact structure is electrically connected to the first electrode layer and the third electrode layer. The top-view pattern of the first contact structure is located outside the first overlapping region and outside the second overlapping region. The second contact structure is electrically connected to the second electrode layer. The top-view pattern of the second contact structure is located outside the first overlapping region and outside the second overlapping region.

According to an embodiment of the invention, in the semiconductor structure, the top-view pattern of the first electrode layer and the top-view pattern of the third electrode layer may extend in a first direction. The top-view pattern of the second electrode layer may extend in a second direction. The first direction may intersect the second direction.

According to an embodiment of the invention, in the semiconductor structure, the first direction may be perpendicular to the second direction.

According to an embodiment of the invention, in the semiconductor structure, the top-view pattern of the first electrode layer and the top-view pattern of the third electrode layer may have the same shape and the same size.

According to an embodiment of the invention, in the semiconductor structure, the top-view pattern of the first electrode layer, the top-view pattern of the second electrode layer, and the top-view pattern of the third electrode layer may have the same shape and the same size.

According to an embodiment of the invention, in the semiconductor structure, the contour of the top-view pattern of the second electrode layer rotated by 90 degrees may completely overlap the contour of the top-view pattern of the first electrode layer and the contour of the top-view pattern of the third electrode layer.

According to an embodiment of the invention, in the semiconductor structure, the top-view pattern of the first electrode layer, the top-view pattern of the second electrode layer, and the top-view pattern of the third electrode layer are, for example, rectangles.

According to an embodiment of the invention, in the semiconductor structure, the first contact structure may be directly connected to the first electrode layer and the third electrode layer. The second contact structure may be directly connected to the second electrode layer.

According to an embodiment of the invention, in the semiconductor structure, the third electrode layer may be directly connected to the first electrode layer. The first contact structure may be directly connected to the first electrode layer. The second contact structure may be directly connected to the second electrode layer.

According to an embodiment of the invention, in the semiconductor structure, the first capacitor structure may further include a fourth electrode layer and a third dielectric layer. The fourth electrode layer is disposed on the third electrode layer. The top-view pattern of the fourth electrode layer may partially overlap the top-view pattern of the third electrode layer to have a third overlapping region. The first overlapping region, the second overlapping region, and the third overlapping region may have the same top-view area. The third dielectric layer is disposed between the third electrode layer and the fourth electrode layer. The top-view pattern of the first contact structure may be located outside the first overlapping region, outside the second overlapping region, and outside the third overlapping region. The second contact structure may be electrically connected to the second electrode layer and the fourth electrode layer. The top-view pattern of the second contact structure may be located outside the first overlapping region, outside the second overlapping region, and outside the third overlapping region.

According to an embodiment of the invention, in the semiconductor structure, the top-view pattern of the second electrode layer and the top-view pattern of the fourth electrode layer may have the same shape and the same size.

According to an embodiment of the invention, the semiconductor structure may further include a second capacitor structure. The second capacitor structure is disposed above the first capacitor structure. The second capacitor structure includes a fourth electrode layer, a fifth electrode layer, a sixth electrode layer, a third dielectric layer, and a fourth dielectric layer. The fifth electrode layer is disposed on the fourth electrode layer. The top-view pattern of the fifth electrode layer may partially overlap the top-view pattern of the fourth electrode layer to have a third overlapping region. The sixth electrode layer is disposed on the fifth electrode layer. The top-view pattern of the sixth electrode layer may partially overlap the top-view pattern of the fifth electrode layer to have a fourth overlapping region. The first overlapping region, the second overlapping region, the third overlapping region, and the fourth overlapping region may have the same top-view area. The third dielectric layer is disposed between the fourth electrode layer and the fifth electrode layer. The fourth dielectric layer is disposed between the fifth electrode layer and the sixth electrode layer. The first contact structure may be electrically connected to the first electrode layer, the third electrode layer, the fourth electrode layer, and the sixth electrode layer. The top-view pattern of the first contact structure may be located outside the first overlapping region, outside the second overlapping region, outside the third overlapping region, and outside the fourth overlapping region. The second contact structure may be electrically connected to the second electrode layer and the fifth electrode layer. The top-view pattern of the second contact structure may be located outside the first overlapping region, outside the second overlapping region, outside the third overlapping region, and outside the fourth overlapping region.

According to an embodiment of the invention, in the semiconductor structure, the first capacitor structure and the second capacitor structure may be disposed in different dielectric layers.

According to an embodiment of the invention, the semiconductor structure may further include a dielectric structure. The dielectric structure is disposed on the substrate. The first capacitor structure may be disposed in the dielectric structure.

According to an embodiment of the invention, in the semiconductor structure, the dielectric structure may include a third dielectric layer, a fourth dielectric layer, and a fifth dielectric layer. The third dielectric layer is disposed on the substrate. The fourth dielectric layer is disposed on the third dielectric layer. The fifth dielectric layer is disposed on the fourth dielectric layer. The semiconductor structure may further include a first interconnect structure and a second interconnect structure. The first interconnect structure is disposed in the third dielectric layer. The second interconnect structure is disposed in the fourth dielectric layer and the fifth dielectric layer. The second interconnect structure is disposed on the first interconnect structure. The second interconnect structure may be electrically connected to the first interconnect structure.

According to an embodiment of the invention, in the semiconductor structure, the first capacitor structure may be disposed in the fourth dielectric layer or the fifth dielectric layer.

According to an embodiment of the invention, in the semiconductor structure, the first contact structure and the second contact structure may be disposed in the fourth dielectric layer and the fifth dielectric layer.

According to an embodiment of the invention, in the semiconductor structure, the first contact structure and the second contact structure may be disposed in the third dielectric layer.

According to an embodiment of the invention, in the semiconductor structure, the dielectric structure may further include a capping layer and a stop layer. The capping layer is disposed between the third dielectric layer and the fourth dielectric layer. The stop layer is disposed between the fourth dielectric layer and the fifth dielectric layer.

According to an embodiment of the invention, in the semiconductor structure, the first capacitor structure may be disposed between the stop layer and the capping layer.

Based on the above description, in the semiconductor structure according to the invention, the top-view pattern of the second electrode layer partially overlaps the top-view pattern of the first electrode layer to have a first overlapping region. The top-view pattern of the third electrode layer partially overlaps the top-view pattern of the second electrode layer to have a second overlapping region. The first overlapping region and the second overlapping region have the same top-view area. Therefore, the capacitor formed by the first electrode layer, the first dielectric layer, and the second electrode layer and the capacitor formed by the second electrode layer, the second dielectric layer, and the third electrode layer can have the same capacitance. In this way, the capacitance of the capacitor structure can be increased, and the design of the capacitor structure is easier.

In order to make the aforementioned and other objects, features and advantages of the invention comprehensible, several exemplary embodiments accompanied with drawings are described in detail below.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

The embodiments are described in detail below with reference to the accompanying drawings, but the embodiments are not intended to limit the scope of the invention. For the sake of easy understanding, the same components in the following description will be denoted by the same reference symbols. In addition, the drawings are for illustrative purposes only and are not drawn to the original dimensions. Furthermore, the features in the top view and the features in the cross-sectional view are not drawn to the same scale. In fact, the dimensions of the various features may be arbitrarily increased or reduced for clarity of discussion.

Figure 1:
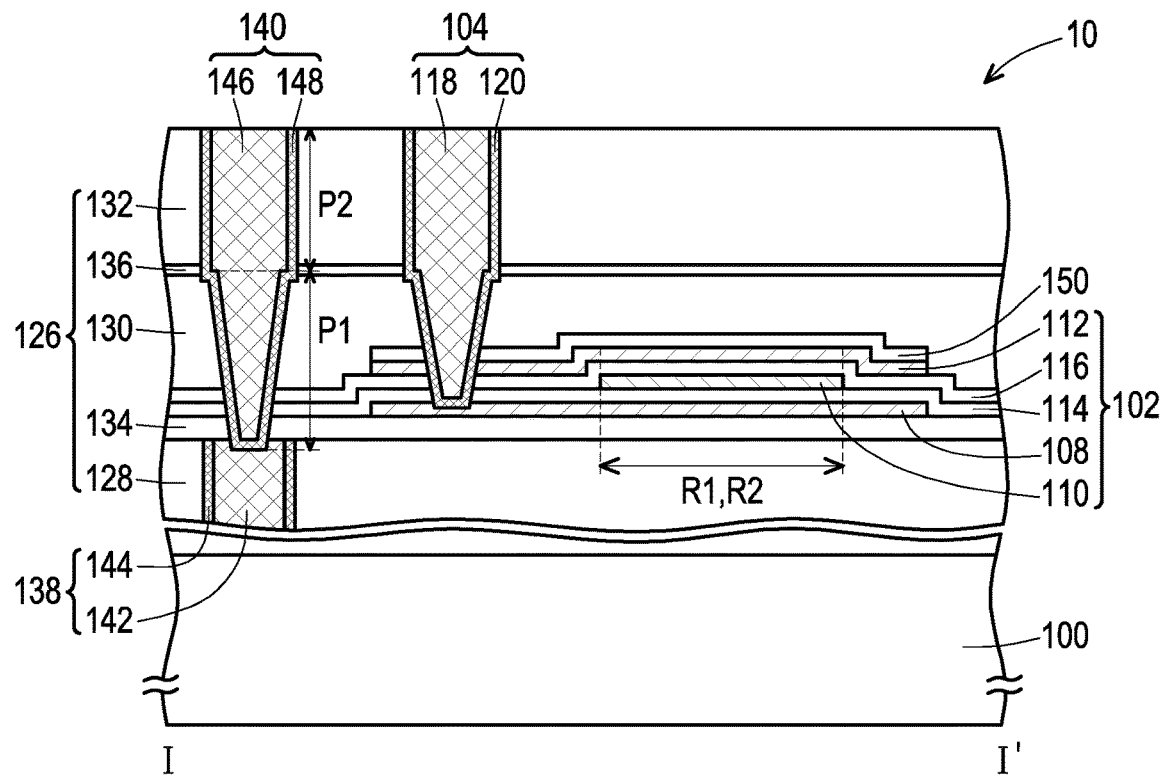
FIG. 1 is a cross-sectional view of a semiconductor structure according to some embodiments of the invention.
Figure 1:
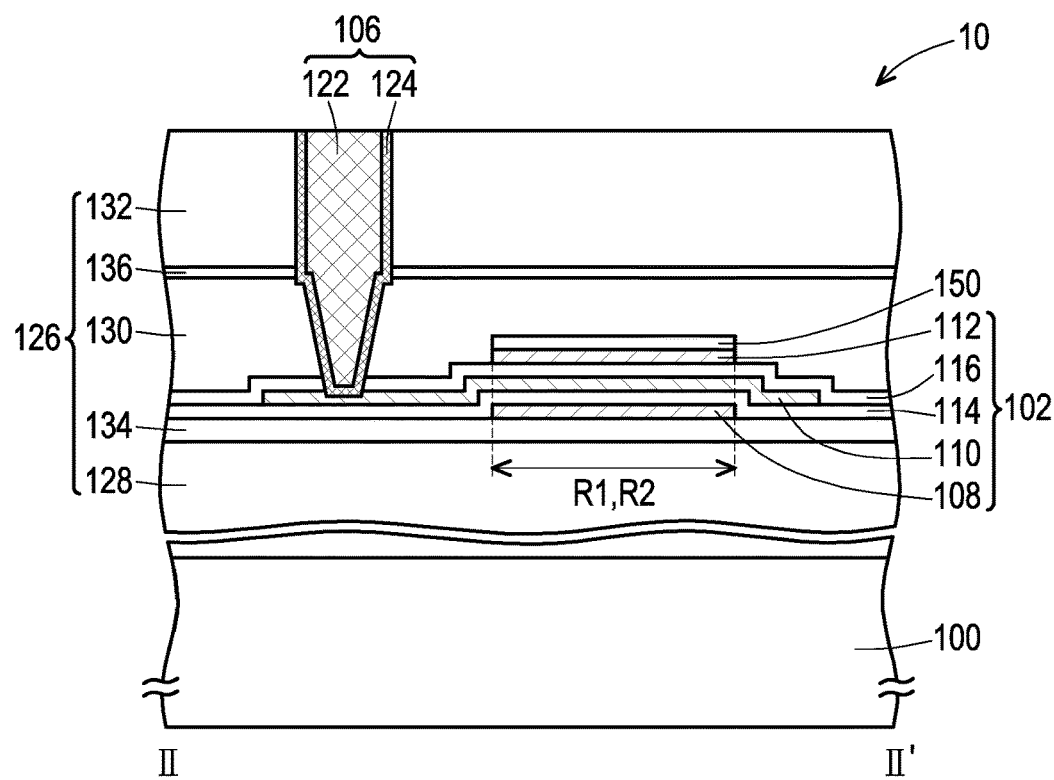
Figure 2:
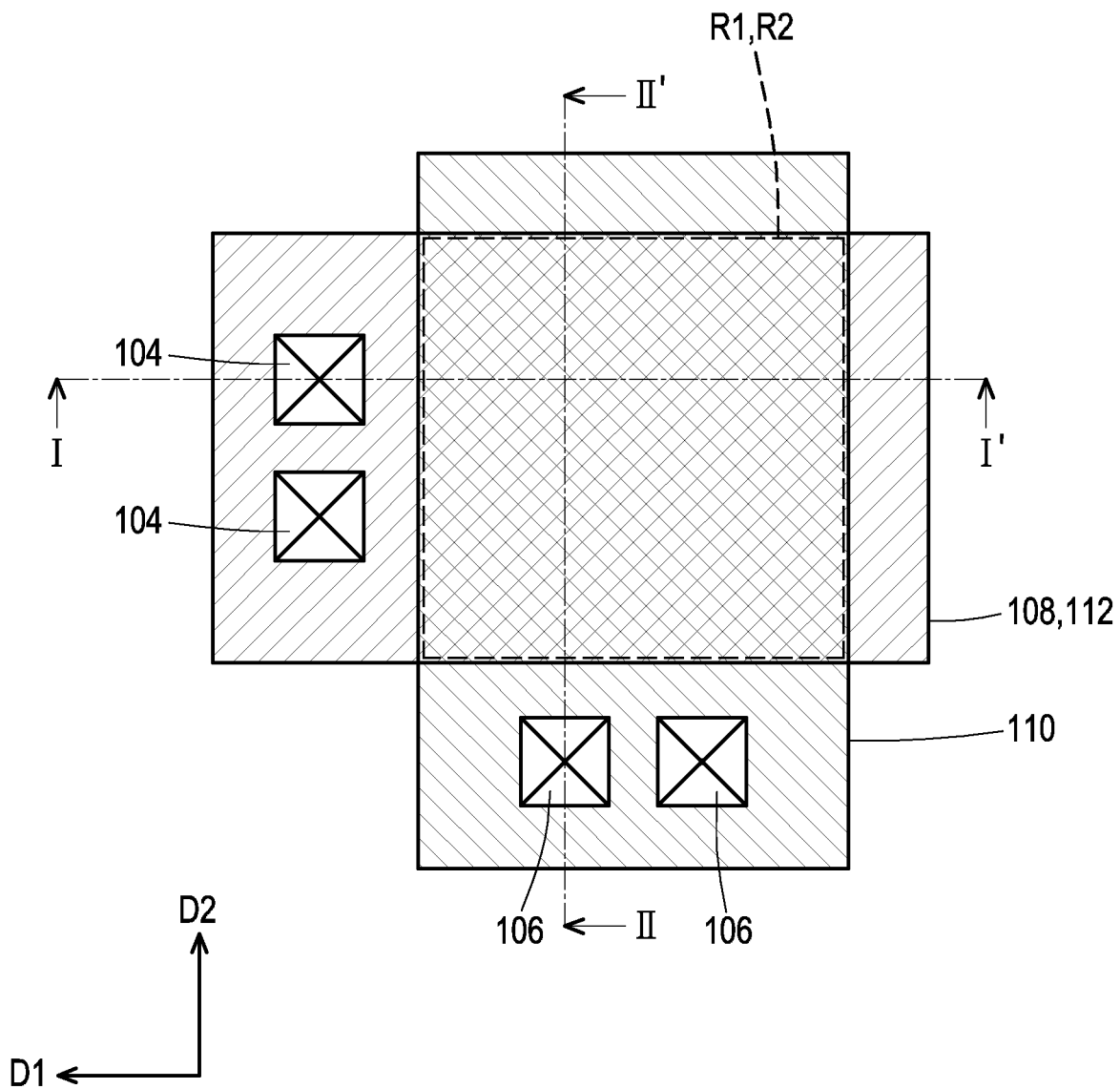
FIG. 2 is a top view of some components in the semiconductor structure of FIG. 1.

FIG. 1 is a cross-sectional view of a semiconductor structure according to some embodiments of the invention. FIG. 2 is a top view of some components in the semiconductor structure of FIG. 1. FIG. 1 is a cross-sectional view taken along section line I-I' and section line II-II' in FIG. 2. In the top view of the following embodiment, some components in the cross-sectional view are omitted to clearly illustrate the configuration relationship between the components in the top view.

Referring to FIG. 1 and FIG. 2, the semiconductor structure 10 includes a substrate 100, a capacitor structure 102, a contact structure 104, and a contact structure 106. In some embodiments, the substrate 100 may be a semiconductor substrate such as a silicon substrate. In addition, although not shown in the figure, the substrate 100 may have required semiconductor devices (e.g., active device), dielectric layers and/or interconnect structures thereon, and the description thereof is omitted here.

The capacitor structure 102 is disposed above the substrate 100. The capacitor structure 102 includes an electrode layer 108, an electrode layer 110, an electrode layer 112, a dielectric layer 114, and a dielectric layer 116. In some embodiments, the material of the electrode layer 108 may be a conductive material, such as tantalum (Ta), tantalum nitride (TaN), or a combination thereof.

The electrode layer 110 is disposed on the electrode layer 108. The top-view pattern of the electrode layer 110 partially overlaps the top-view pattern of the electrode layer 108 to have an overlapping region R1. In some embodiments, the material of the electrode layer 110 may be a conductive material, such as tantalum, tantalum nitride, or a combination thereof.

The electrode layer 112 is disposed on the electrode layer 110. The top-view pattern of the electrode layer 112 partially overlaps the top-view pattern of the electrode layer 110 to have an overlapping region R2. The overlapping region R1 and the overlapping region R2 have the same top-view area. Therefore, the capacitor formed by the electrode layer 108, the dielectric layer 114, and the electrode layer 110 and the capacitor formed by the electrode layer 110, the dielectric layer 116, and the electrode layer 112 can have the same capacitance. In the text, the "top-view area" may be the area defined by the contour of the top-view pattern of the component (e.g., overlapping region). In some embodiments, the material of the electrode layer 112 may be a conductive material, such as tantalum, tantalum nitride, or a combination thereof.

In some embodiments, the top-view pattern of the electrode layer 108 and the top-view pattern of the electrode layer 112 may extend in a direction D1. The top-view pattern of the electrode layer 110 may extend in a direction D2. The direction D1 may intersect the direction D2. In some embodiments, the direction D1 may be perpendicular to the direction D2.

In some embodiments, the top-view pattern of the electrode layer 108, the top-view pattern of the electrode layer 110, and the top-view pattern of the electrode layer 112 are, for example, rectangles. In some embodiments, the contour of the top-view pattern of the electrode layer 108 and the contour of the top-view pattern of the electrode layer 112 may completely overlap. In some embodiments, the top-view pattern of the electrode layer 108 and the top-view pattern of the electrode layer 112 may have the same shape and the same size (e.g., length and width), thereby reducing the number of photomasks, but the invention is not limited thereto. In addition, when the top-view pattern of the electrode layer 108 and the top-view pattern of the electrode layer 112 have the same shape and the same size (e.g., length and width), even if the overlay shift occurs between the electrode layer 108, the electrode layer 110, and the electrode layer 112, the capacitor formed by the electrode layer 108, the dielectric layer 114, and the electrode layer 110 and the capacitor formed by the electrode layer 110, the dielectric layer 116, and the electrode layer 112 can still have the same capacitance.

In some embodiments, the top-view pattern of the electrode layer 108, the top-view pattern of the electrode layer 110, and the top-view pattern of the electrode layer 112 may have the same shape and the same size (e.g., length and width). In some embodiments, the contour of the top-view pattern of the electrode layer 110 rotated by 90 degrees may completely overlap the contour of the top-view pattern of the electrode layer 108 and the contour of the top-view pattern of the electrode layer 112.

In the present embodiment, the capacitor structure 102 includes three electrode layers (e.g., electrode layer 108, electrode layer 110, and electrode layer 112), for example, but the invention is not limited thereto. As long as the capacitor structure 102 includes three or more electrode layers, and the overlapping regions between the three or more electrode layers have the same top-view area, it falls within the scope of the invention.

The dielectric layer 114 is disposed between the electrode layer 108 and the electrode layer 110. In some embodiments, the material of the dielectric layer 114 is, for example, silicon nitride or a high dielectric constant (high-k) dielectric material. In the text, the "high dielectric constant" may be defined as a dielectric constant greater than 7. In some embodiments, the high-k dielectric material is, for example, aluminum oxide ($Al_2O_3$), zirconium oxide ($ZrO_2$), or tantalum oxide ($Ta_2O_5$).

The dielectric layer 116 is disposed between the electrode layer 110 and the electrode layer 112. In some embodiments, the material of the dielectric layer 116 is, for example, silicon nitride or a high-k dielectric material. In some embodiments, the high-k dielectric material is, for example, aluminum oxide ($Al_2O_3$), zirconium oxide ($ZrO_2$), or tantalum oxide ($Ta_2O_5$).

The contact structure 104 is electrically connected to the electrode layer 108 and the electrode layer 112. The top-view pattern of the contact structure 104 is located outside the overlapping region R1 and outside the overlapping region R2. In some embodiments, the contact structure 104 may be directly connected to the electrode layer 108 and the electrode layer 112. The contact structure 104 may be a single-layer structure or a multilayer structure. In some embodiments, the contact structure 104 may include a contact 118 and a barrier layer 120. In some embodiments, the material of the contact 118 is a conductive material such as copper. In some embodiments, the material of the barrier layer 120 is, for example, metal (e.g., tantalum), metal nitride (e.g., tantalum nitride), or a combination thereof. In other embodiments, the barrier layer 120 may be omitted.

The contact structure 106 is electrically connected to the electrode layer 110. The top-view pattern of the contact structure 106 is located outside the overlapping region R1 and outside the overlapping region R2. In some embodiments, the contact structure 106 may be directly connected to the electrode layer 110. The contact structure 106 may be a single-layer structure or a multilayer structure. In some embodiments, the contact structure 106 may include a contact 122 and a barrier layer 124. In some embodiments, the material of the contact 122 is a conductive material such as copper. In some embodiments, the material of the barrier layer 124 is, for example, metal (e.g., tantalum), metal nitride (e.g., tantalum nitride), or a combination thereof. In other embodiments, the barrier layer 124 may be omitted.

In FIG. 2, the number of the contact structures 104 is, for example, two, and the number of the contact structures 106 is, for example, two, but the invention is not limited thereto. As long as the number of the contact structures 104 is at least one, and the number of the contact structures 106 is at least one, it falls within the scope of the invention. In the present embodiment, as shown in FIG. 2, the contact structure 104 may be located on one side of the overlapping region (e.g., overlapping region R1), but the invention is not limited thereto. In other embodiments, the contact structure 104 may be located on two sides of the overlapping region (e.g., overlapping region R1). In the present embodiment, as shown in FIG. 2, the contact structure 106 may be located on one side of the overlapping region (e.g., overlapping region R1), but the invention is not limited thereto. In other embodiments, the contact structure 106 may be located on two sides of the overlapping region (e.g., overlapping region R1).

The semiconductor structure 10 may further include a dielectric structure 126. The dielectric structure 126 is disposed on the substrate 100. The capacitor structure 102 may be disposed in the dielectric structure 126. The dielectric structure 126 may include a dielectric layer 128, a dielectric layer 130, and a dielectric layer 132. The dielectric layer 128 is disposed on the substrate 100. In some embodiments, the material of the dielectric layer 128 is, for example, silicon oxide. The dielectric layer 130 is disposed on the dielectric layer 128. In some embodiments, the capacitor structure 102 may be disposed in the dielectric layer 130. In some embodiments, the material of the dielectric layer 130 is, for example, silicon oxide. The dielectric layer 132 is disposed on the dielectric layer 130. In some embodiments, the contact structure 104 and the contact structure 106 may be disposed in the dielectric layer 130 and the dielectric layer 132. In some embodiments, the material of the dielectric layer 132 is, for example, silicon oxide.

The dielectric structure 126 may further include at least one of a capping layer 134 and a stop layer 136. The capping layer 134 is disposed between the dielectric layer 128 and the dielectric layer 130. The capping layer 134 may be used as a diffusion barrier layer. In some embodiments, the capacitor structure 102 may be disposed on the capping layer 134. In some embodiments, the electrode layer 108 may be disposed on the capping layer 134. In some embodiments, the material of the capping layer 134 is, for example, a dielectric material, such as silicon carbonitride (SiCN) or silicon nitride. The stop layer 136 is disposed between the dielectric layer 130 and the dielectric layer 132. In some embodiments, the capacitor structure 102 may be disposed between the stop layer 136 and the capping layer 134. In some embodiments, the material of the stop layer 136 is, for example, a dielectric material such as silicon nitride.

The semiconductor structure 10 may further include an interconnect structure 138 and an interconnect structure 140. The interconnect structure 138 is disposed in the dielectric layer 128. The interconnect structure 138 may be a single-layer structure or a multilayer structure. In some embodiments, the interconnect structure 138 may include a conductive layer 142 and a barrier layer 144. A portion of the interconnect structure 138 shown in FIG. 1 may be a conductive line portion. In some embodiments, the material of the conductive layer 142 is a conductive material such as copper. In some embodiments, the material of the barrier layer 144 is, for example, metal (e.g., tantalum), metal nitride (e.g., tantalum nitride), or a combination thereof. In other embodiments, the barrier layer 144 may be omitted.

The interconnect structure 140 is disposed in the dielectric layer 130 and the dielectric layer 132. The interconnect structure 140 is disposed on the interconnect structure 138. The interconnect structure 140 may be electrically connected to the interconnect structure 138. The interconnect structure 140 may be a single-layer structure or a multilayer structure. In some embodiments, the interconnect structure 140 may include a via portion P1 and a conductive line portion P2. The via portion P1 is disposed in the dielectric layer 130. The conductive line portion P2 is disposed in the dielectric layer 132 and is connected to the via portion P1. In some embodiments, the interconnect structure 140 may include a conductive layer 146 and a barrier layer 148. In some embodiments, the material of the conductive layer 146 is a conductive material such as copper. In some embodiments, the material of the barrier layer 148 is, for example, metal (e.g., tantalum), metal nitride (e.g., tantalum nitride), or a combination thereof. In other embodiments, the barrier layer 148 may be omitted.

The semiconductor structure 10 may further include a capping layer 150. The capping layer 150 is disposed on the capacitor structure 102 and is disposed in the dielectric structure 126. In some embodiments, the material of the capping layer 150 is, for example, a dielectric material such as silicon nitride.

In addition, the semiconductor structure 10 may further include other interconnect structures (not shown) respectively used to be connected to the contact structure 104, the contact structure 106, and the interconnect structure 140, and the description thereof is omitted here.

Based on the above embodiments, in the semiconductor structure 10, the top-view pattern of the electrode layer 110 partially overlaps the top-view pattern of the electrode layer 108 to have the overlapping region R1. The top-view pattern of the electrode layer 112 partially overlaps the top-view pattern of the electrode layer 110 to have the overlapping region R2. The overlapping region R1 and the overlapping region R2 have the same top-view area. Therefore, the capacitor formed by the electrode layer 108, the dielectric layer 114, and the electrode layer 110 and the capacitor formed by the electrode layer 110, the dielectric layer 116, and the electrode layer 112 can have the same capacitance. In this way, the capacitance of the capacitor structure 102 can be increased, and the design of the capacitor structure 102 is easier.

Figure 3:
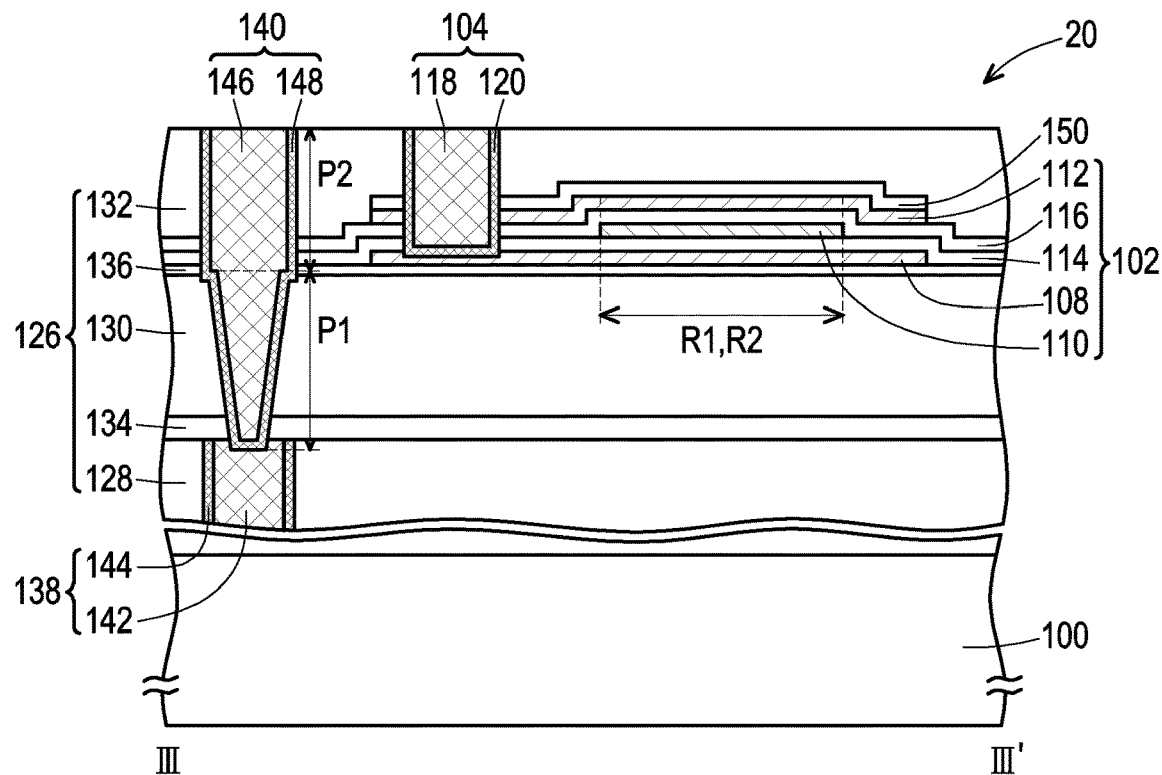
FIG. 3 is a cross-sectional view of a semiconductor structure according to other embodiments of the invention.
Figure 3:
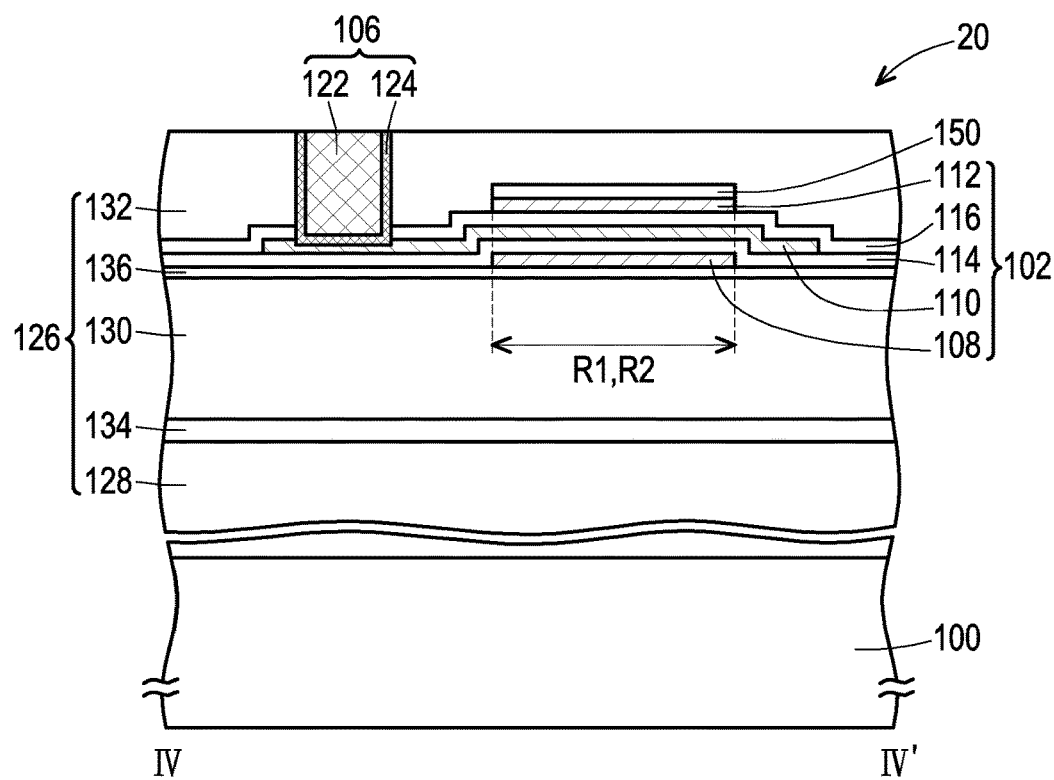
Figure 4:
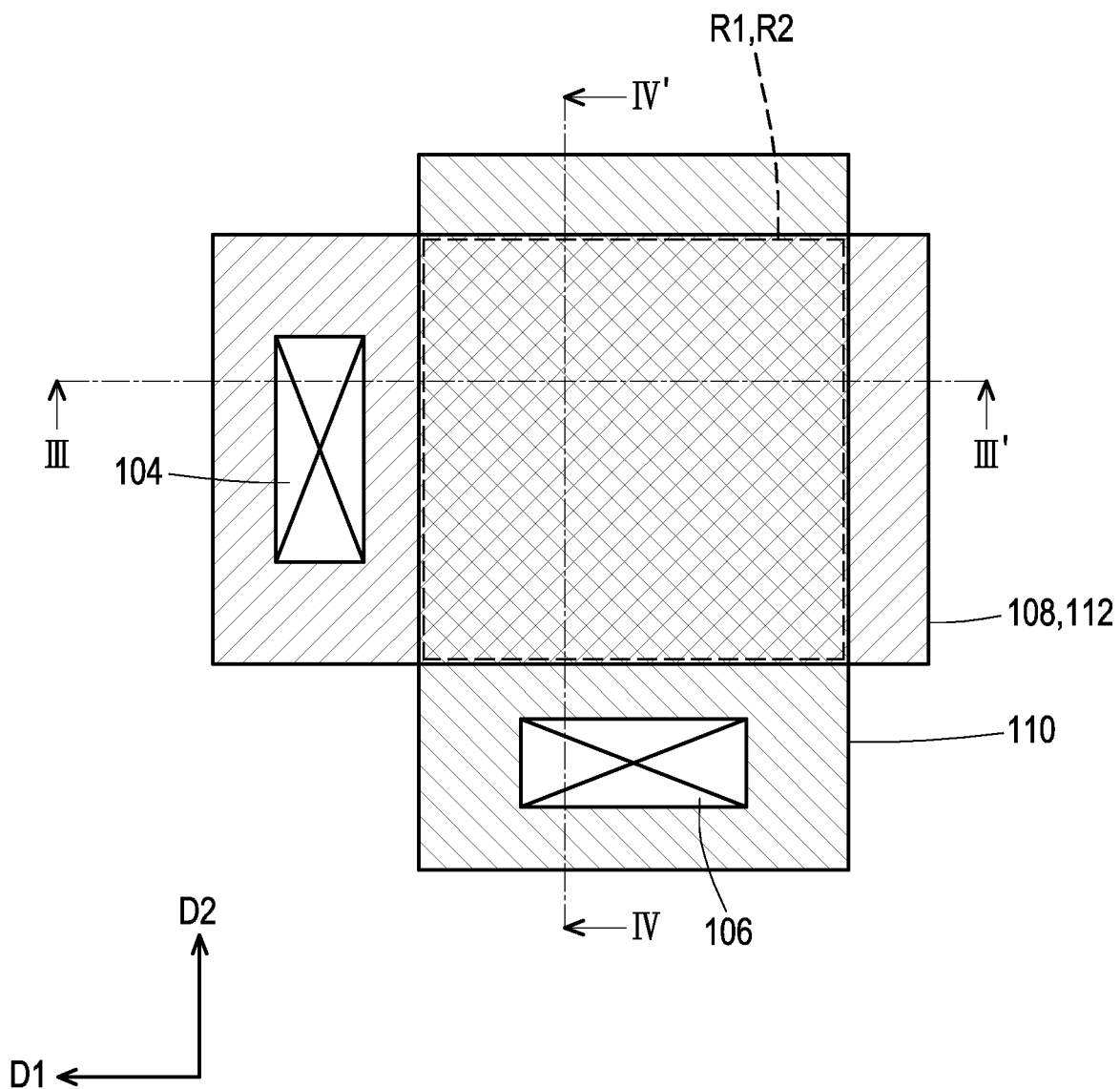
FIG. 4 is a top view of some components in the semiconductor structure of FIG. 3.

FIG. 3 is a cross-sectional view of a semiconductor structure according to other embodiments of the invention. FIG. 4 is a top view of some components in the semiconductor structure of FIG. 3. FIG. 3 is a cross-sectional view taken along section line III-III' and section line IV-IV' in FIG. 4.

Referring to FIG. 1 and FIG. 3, the difference between the semiconductor structure 20 of FIG. 3 and the semiconductor structure 10 of FIG. 1 is as follows. In the semiconductor structure 20, the capacitor structure 102 may be disposed in the dielectric layer 132, and the contact structure 104 and the contact structure 106 may be disposed in the dielectric layer 132. In FIG. 4, the number of the contact structures 104 is, for example, one, and the number of the contact structures 106 is, for example, one, but the invention is not limited thereto. As long as the number of the contact structures 104 is at least one, and the number of the contact structures 106 is at least one, it falls within the scope of the invention. In addition, in the semiconductor structure 10 of FIG. 1 and the semiconductor structure 20 of FIG. 3, the same components are denoted by the same reference symbols, and the description thereof is omitted.

Based on the above embodiments, in the semiconductor structure 20, the top-view pattern of the electrode layer 110 partially overlaps the top-view pattern of the electrode layer 108 to have the overlapping region R1. The top-view pattern of the electrode layer 112 partially overlaps the top-view pattern of the electrode layer 110 to have the overlapping region R2. The overlapping region R1 and the overlapping region R2 have the same top-view area. Therefore, the capacitor formed by the electrode layer 108, the dielectric layer 114, and the electrode layer 110 and the capacitor formed by the electrode layer 110, the dielectric layer 116, and the electrode layer 112 can have the same capacitance. In this way, the capacitance of the capacitor structure 102 can be increased, and the design of the capacitor structure 102 is easier.

Figure 5:
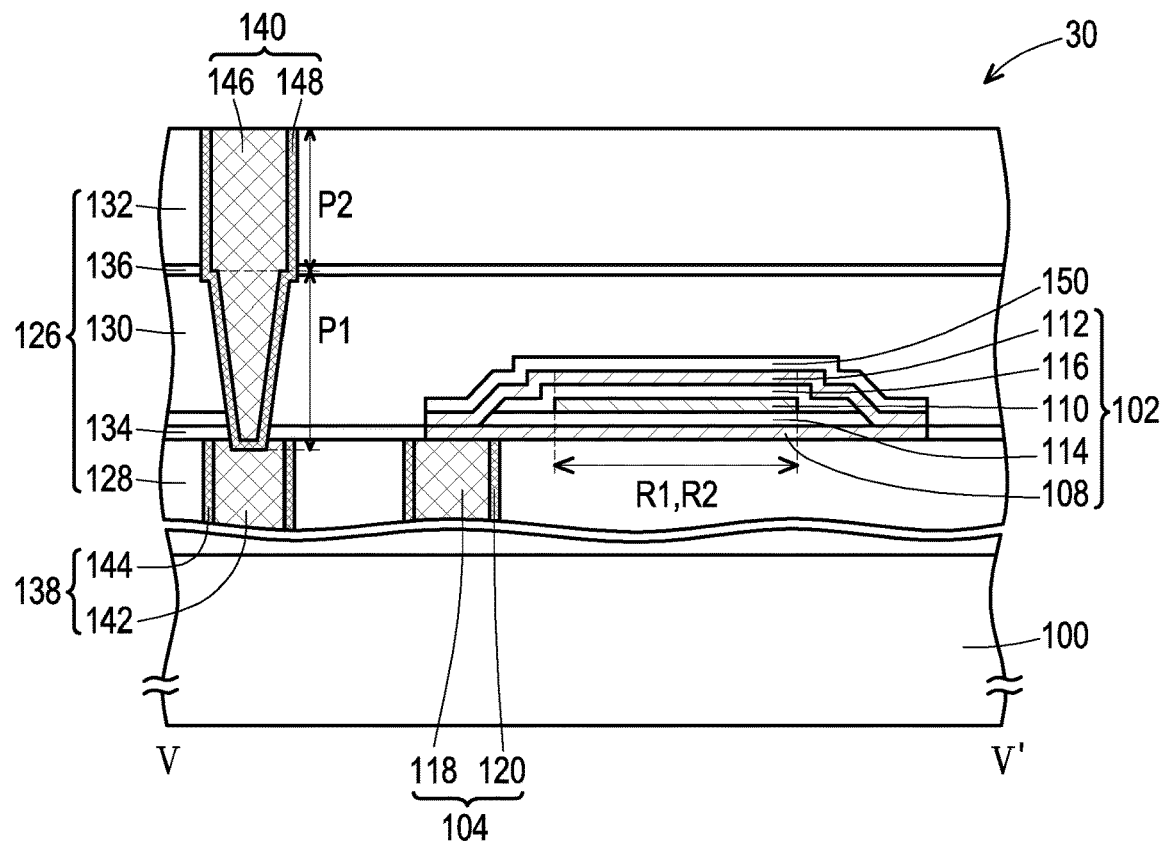
FIG. 5 is a cross-sectional view of a semiconductor structure according to other embodiments of the invention.
Figure 5:
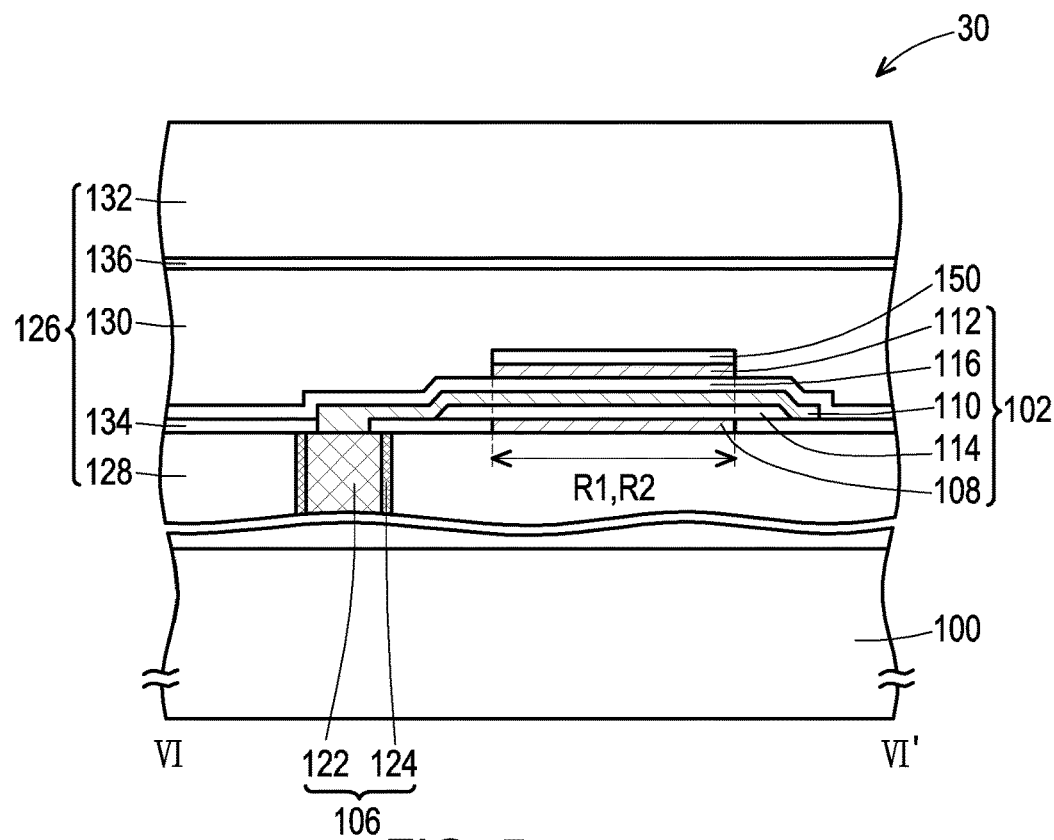
Figure 6:
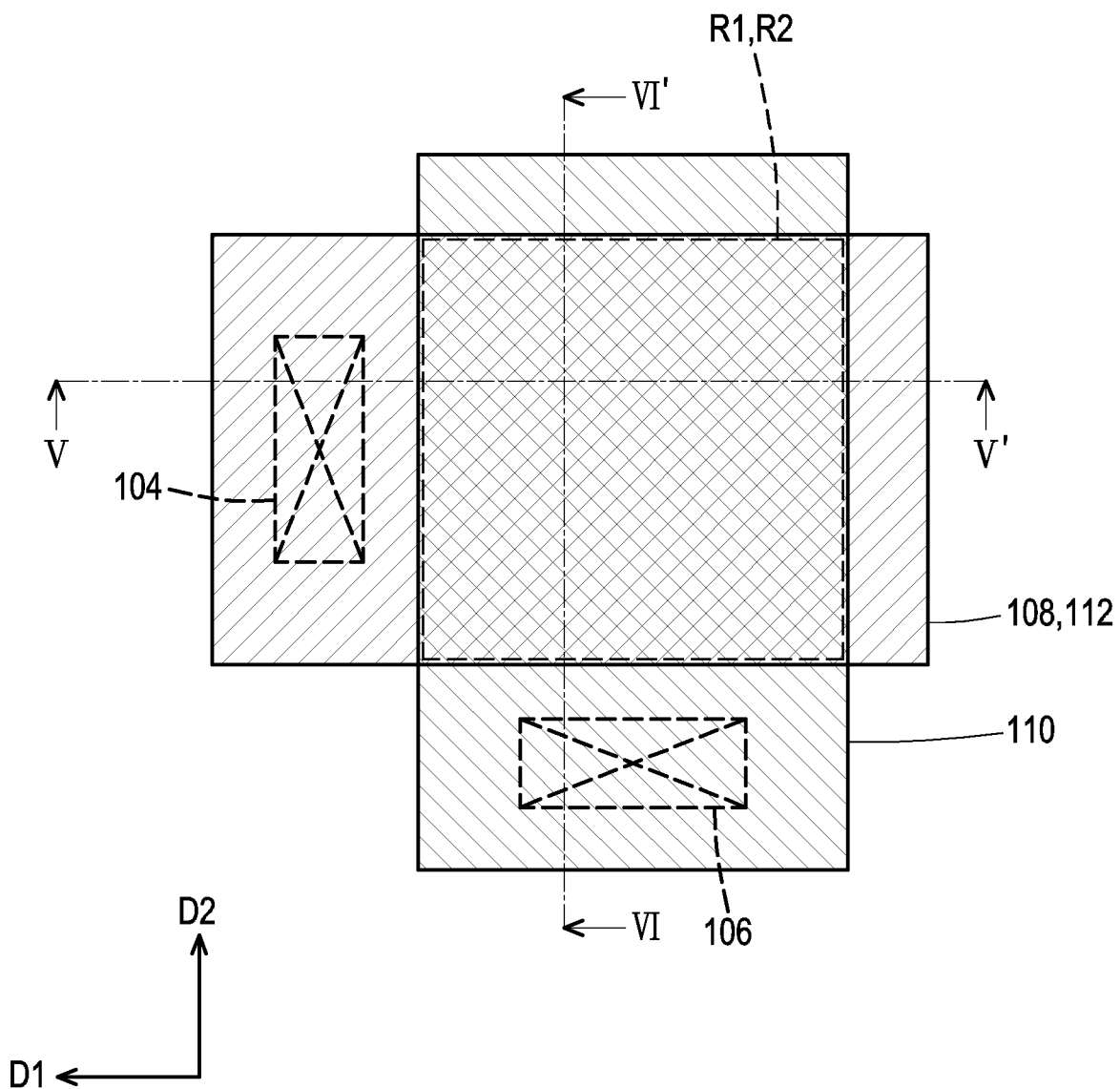
FIG. 6 is a top view of some components in the semiconductor structure of FIG. 5.

FIG. 5 is a cross-sectional view of a semiconductor structure according to other embodiments of the invention. FIG. 6 is a top view of some components in the semiconductor structure of FIG. 5. FIG. 5 is a cross-sectional view taken along section line V-V' and section line VI-VI' in FIG. 6.

Referring to FIG. 1, FIG. 2, FIG. 5, and FIG. 6, the difference between the semiconductor structure 30 of FIG. 5 and the semiconductor structure 10 of FIG. 1 is as follows. In the semiconductor structure 30, the electrode layer 112 may be directly connected to the electrode layer 108, the contact structure 104 may be directly connected to the electrode layer 108, and the contact structure 106 may be directly connected to the electrode layer 110. In the semiconductor structure 30, the contact structure 104 and the contact structure 106 may be disposed in the dielectric layer 128. In the semiconductor structure 30, the electrode layer 108 may be disposed in the capping layer 134 and may be disposed on the dielectric layer 128.

In FIG. 6, the number of the contact structures 104 is, for example, one, and the number of the contact structures 106 is, for example, one, but the invention is not limited thereto. As long as the number of the contact structures 104 is at least one, and the number of the contact structures 106 is at least one, it falls within the scope of the invention. In addition, in the semiconductor structure 10 of FIG. 1 and the semiconductor structure 30 of FIG. 5, the same components are denoted by the same reference symbols, and the description thereof is omitted.

Based on the above embodiments, in the semiconductor structure 30, the top-view pattern of the electrode layer 110 partially overlaps the top-view pattern of the electrode layer 108 to have the overlapping region R1. The top-view pattern of the electrode layer 112 partially overlaps the top-view pattern of the electrode layer 110 to have the overlapping region R2. The overlapping region R1 and the overlapping region R2 have the same top-view area. Therefore, the capacitor formed by the electrode layer 108, the dielectric layer 114, and the electrode layer 110 and the capacitor formed by the electrode layer 110, the dielectric layer 116, and the electrode layer 112 can have the same capacitance. In this way, the capacitance of the capacitor structure 102 can be increased, and the design of the capacitor structure 102 is easier.

Figure 7:
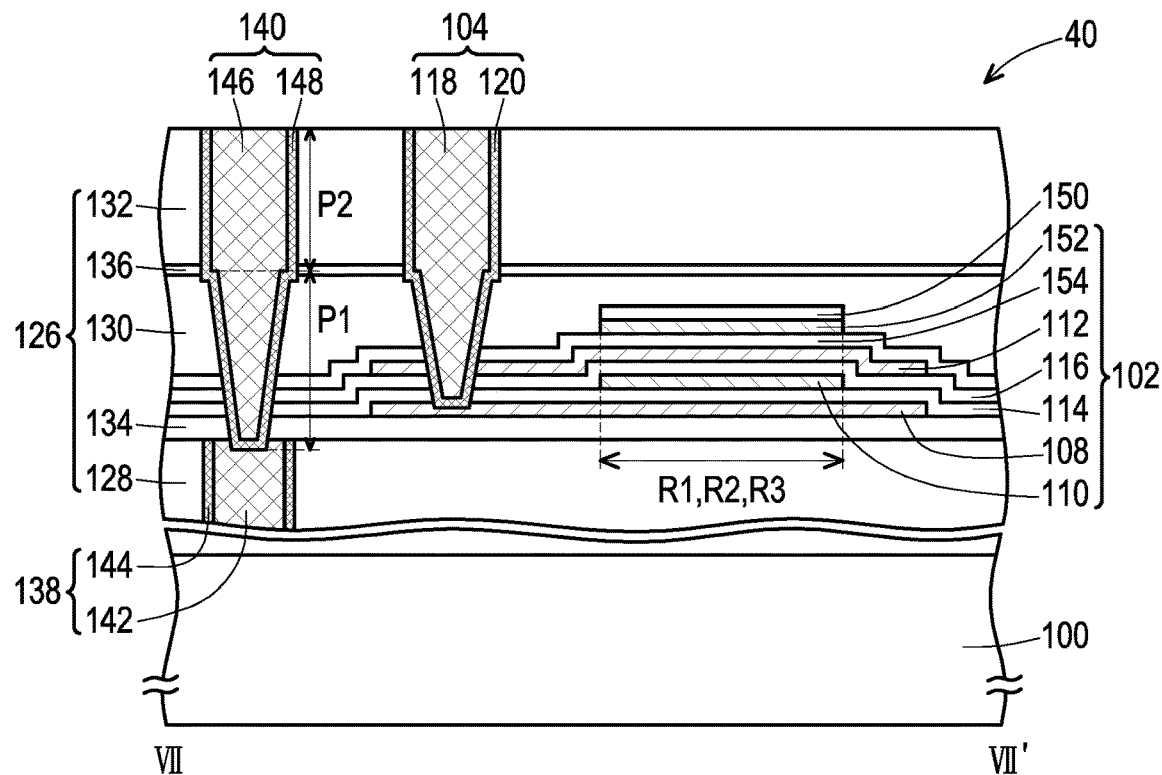
FIG. 7 is a cross-sectional view of a semiconductor structure according to other embodiments of the invention.
Figure 7:
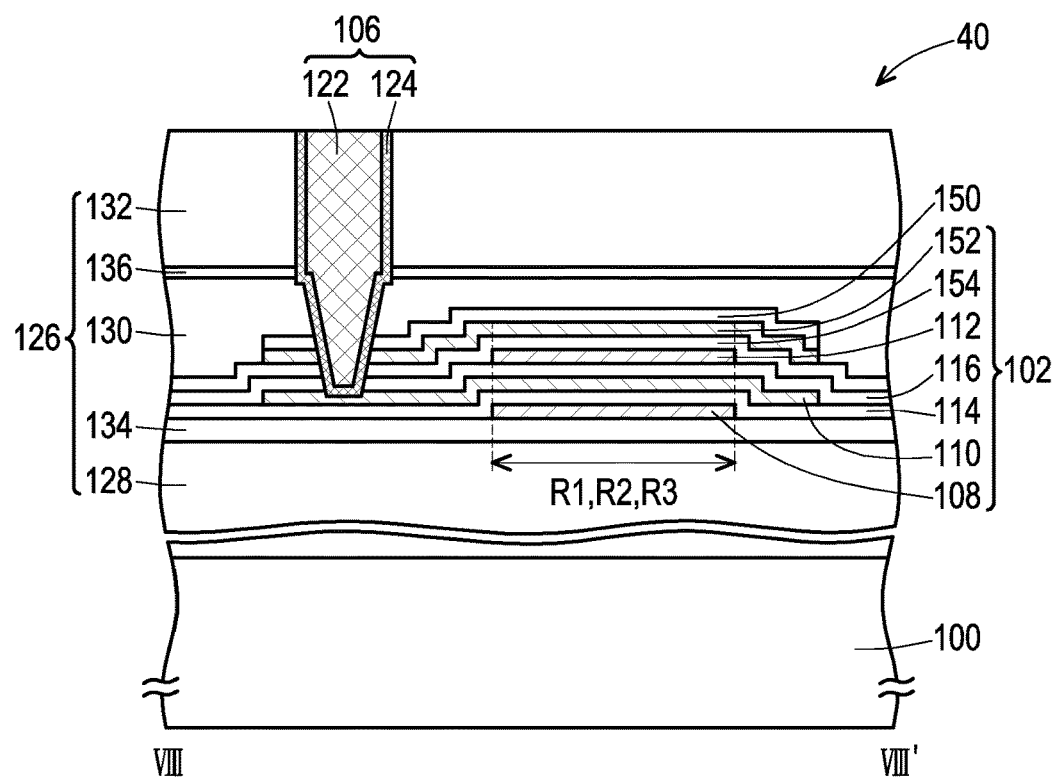
Figure 8:
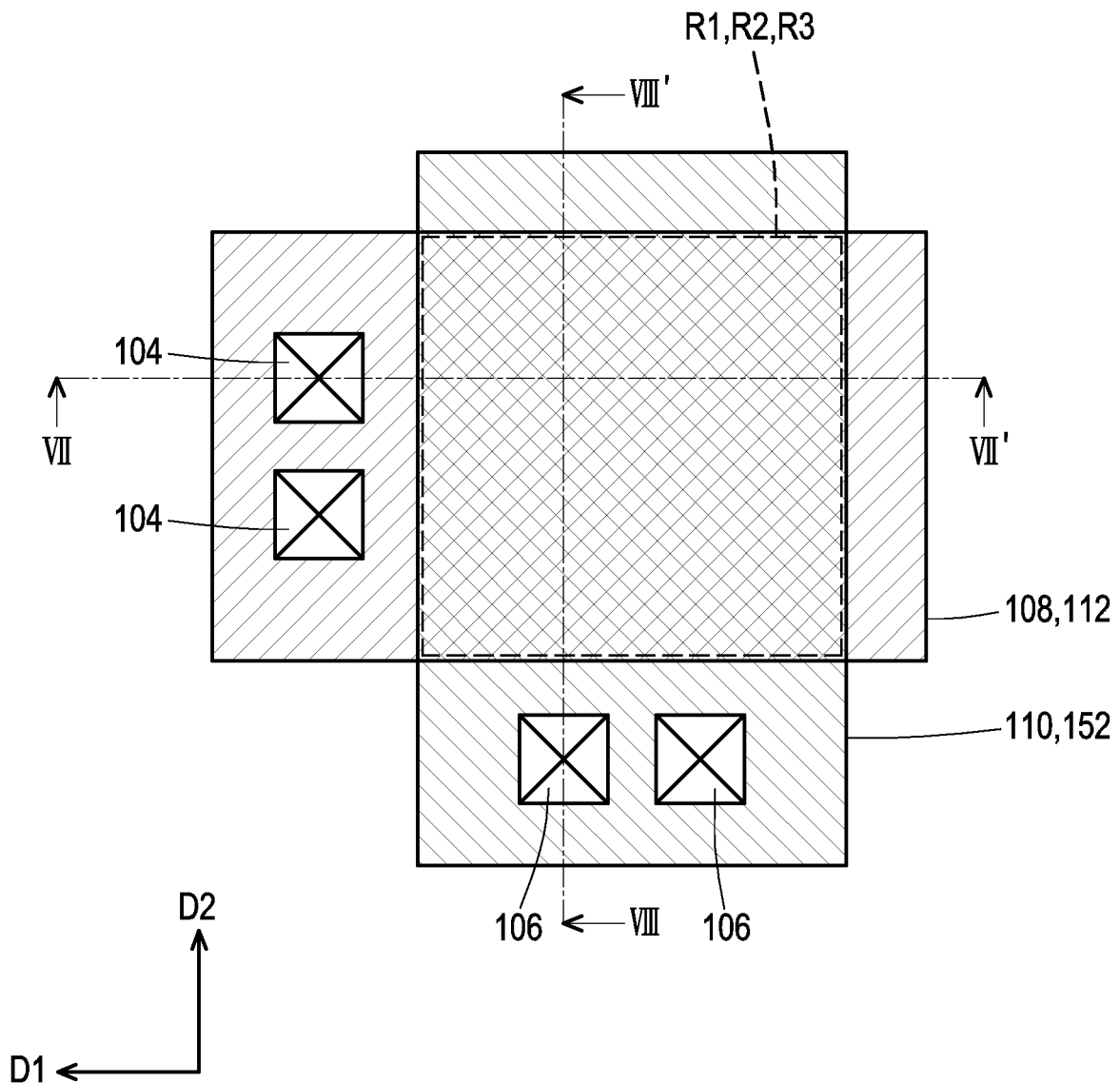
FIG. 8 is a top view of some components in the semiconductor structure of FIG. 7.
Figure 9:
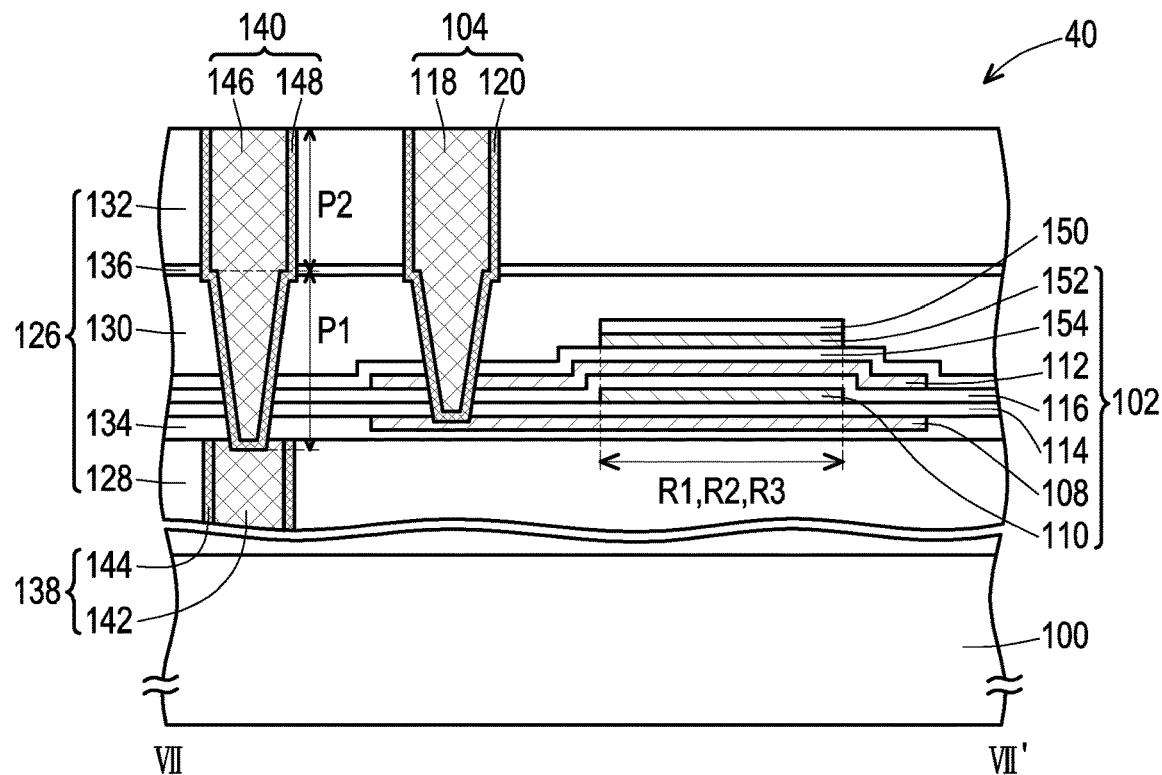
FIG. 9 is a cross-sectional view of a semiconductor structure according to other embodiments of the invention.
Figure 9:
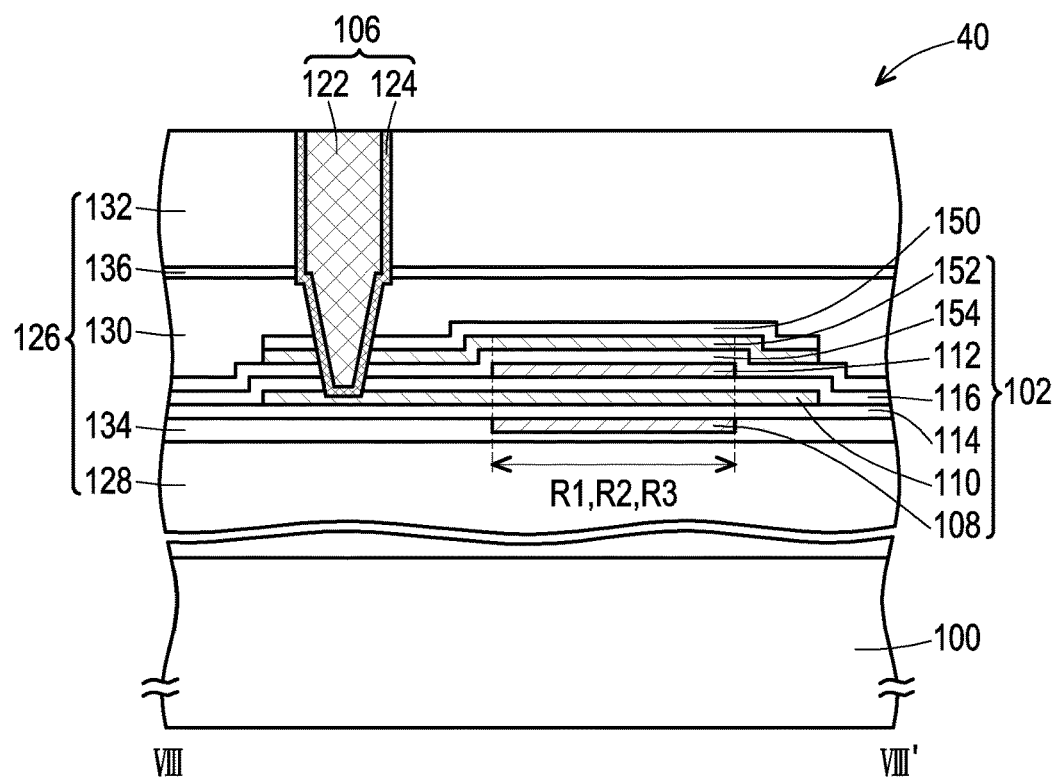

FIG. 7 is a cross-sectional view of a semiconductor structure according to other embodiments of the invention. FIG. 8 is a top view of some components in the semiconductor structure of FIG. 7. FIG. 9 is a cross-sectional view of a semiconductor structure according to other embodiments of the invention. FIG. 7 and FIG. 9 are cross-sectional views taken along section line VII-VII' and section line VIII-VIII' in FIG. 8.

Referring to FIG. 1, FIG. 2, FIG. 7, and FIG. 8, the difference between the semiconductor structure 40 of FIG. 7 and the semiconductor structure 10 of FIG. 1 is as follows. In the semiconductor structure 40, the capacitor structure 102 may further include an electrode layer 152 and a dielectric layer 154. The electrode layer 152 is disposed on the electrode layer 112. The top-view pattern of the electrode layer 152 may partially overlap the top-view pattern of the electrode layer 112 to have an overlapping region R3. The overlapping region R1, the overlapping region R2, and the overlapping region R3 may have the same top-view area. In some embodiments, the material of the electrode layer 152 may be a conductive material, such as tantalum, tantalum nitride, or a combination thereof.

In some embodiments, the top-view pattern of the electrode layer 110 and the top-view pattern of the electrode layer 152 may extend in the direction D2. In some embodiments, the top-view pattern of the electrode layer 152 is, for example, a rectangle. In some embodiments, the contour of the top-view pattern of the electrode layer 110 and the contour of the top-view pattern of the electrode layer 152 may completely overlap. In some embodiments, the top-view pattern of the electrode layer 110 and the top-view pattern of the electrode layer 152 may have the same shape and the same size (e.g., length and width), thereby reducing the number of photomasks, but the invention is not limited thereto. In addition, when the top-view pattern of the electrode layer 108 and the top-view pattern of the electrode layer 112 have the same shape and the same size (e.g., length and width), and the top-view pattern of the electrode layer 110 and the top-view pattern of the electrode layer 152 have the same shape and the same size (e.g., length and width), even if the overlay shift occurs between the electrode layer 108, the electrode layer 110, the electrode layer 112, and the electrode layer 152, the capacitor formed by the electrode layer 108, the dielectric layer 114, and the electrode layer 110, the capacitor formed by the electrode layer 110, the dielectric layer 116, and the electrode layer 112, and the capacitor formed by the electrode layer 112, the dielectric layer 154, and the electrode layer 152 can still have the same capacitance.

In some embodiments, the top-view pattern of the electrode layer 108, the top-view pattern of the electrode layer 110, the top-view pattern of the electrode layer 112, and the top-view pattern of the electrode layer 152 may have the same shape and the same size (e.g., length and width). In some embodiments, the contour of the top-view pattern of the electrode layer 110 rotated by 90 degrees and the contour of the top-view pattern of the electrode layer 152 rotated by 90 degrees may completely overlap the contour of the top-view pattern of the electrode layer 108 and the contour of the top-view pattern of the electrode layer 112.

The dielectric layer 154 is disposed between electrode layer 112 and electrode layer 152. In some embodiments, the material of the dielectric layer 154 is, for example, silicon nitride or a high-k dielectric material. In some embodiments, the high-k dielectric material is, for example, aluminum oxide ($Al_2O_3$), zirconium oxide ($ZrO_2$), or tantalum oxide ($Ta_2O_5$).

The contact structure 104 may be electrically connected to the electrode layer 108 and the electrode layer 112. The top-view pattern of the contact structure 104 may be located outside the overlapping region R1, outside the overlapping region R2, and outside the overlapping region R3. The contact structure 106 may be electrically connected to the electrode layer 110 and the electrode layer 152. The top-view pattern of the contact structure 106 may be located outside the overlapping region R1, outside the overlapping region R2, and outside the overlapping region R3.

In FIG. 7, the electrode layer 108 is disposed on the top surface of the capping layer 134, but the invention is not limited thereto. In other embodiments, as shown in FIG. 9, the electrode layer 108 may be buried in the capping layer 134, thereby reducing the height of the top surface of the capacitor structure 102.

In addition, in the semiconductor structure 10 of FIG. 1 and the semiconductor structure 40 of FIG. 7, the same components are denoted by the same reference symbols, and the description thereof is omitted.

Based on the above embodiments, in the semiconductor structure 40, the top-view pattern of the electrode layer 110 partially overlaps the top-view pattern of the electrode layer 108 to have the overlapping region R1. The top-view pattern of the electrode layer 112 partially overlaps the top-view pattern of the electrode layer 110 to have the overlapping region R2. The top-view pattern of the electrode layer 152 partially overlaps the top-view pattern of the electrode layer 112 to have the overlapping region R3. The overlapping region R1, the overlapping region R2, and the overlapping region R3 have the same top-view area. Therefore, the capacitor formed by the electrode layer 108, the dielectric layer 114, and the electrode layer 110, the capacitor formed by the electrode layer 110, the dielectric layer 116, and the electrode layer 112, and the capacitor formed by the electrode layer 112, the dielectric layer 154, and the electrode layer 152 can have the same capacitance. In this way, the capacitance of the capacitor structure 102 can be increased, and the design of the capacitor structure 102 is easier.

Figure 10:
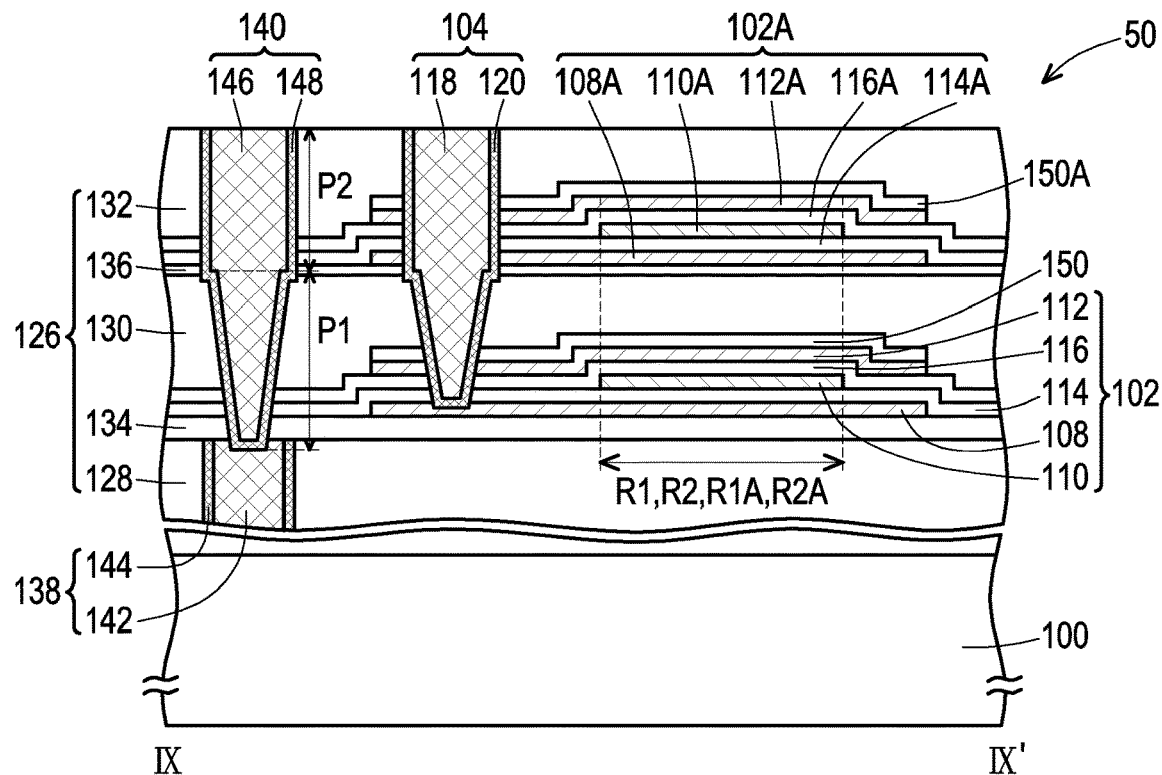
FIG. 10 is a cross-sectional view of a semiconductor structure according to other embodiments of the invention.
Figure 10:
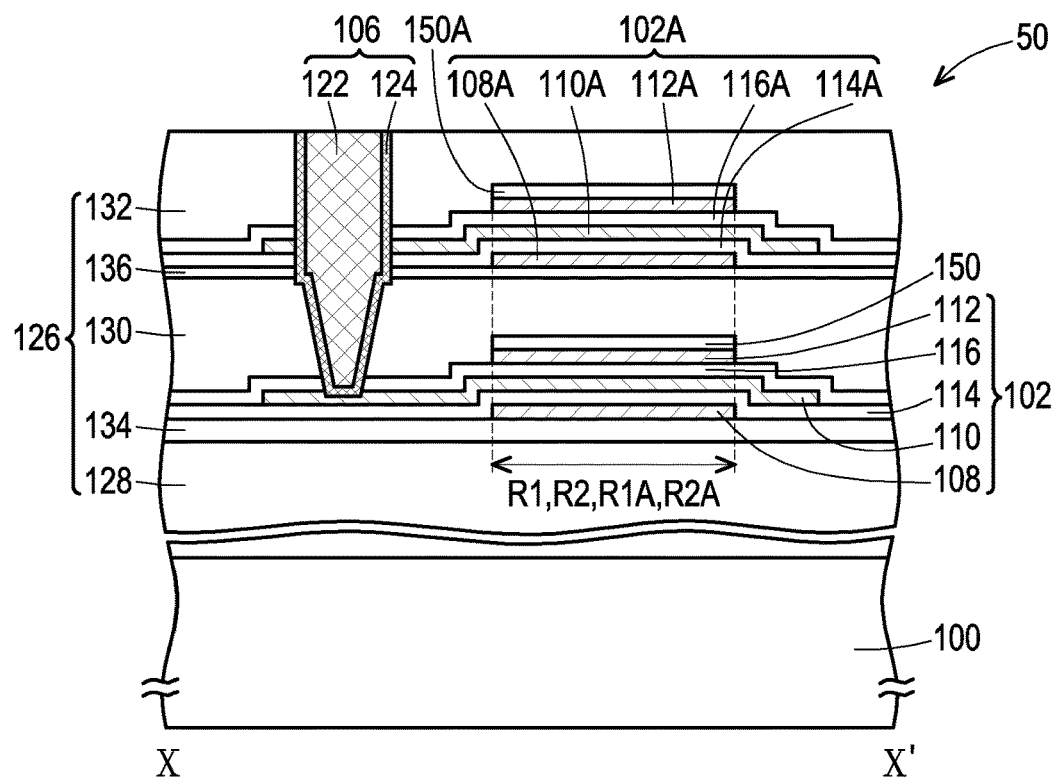
Figure 11:
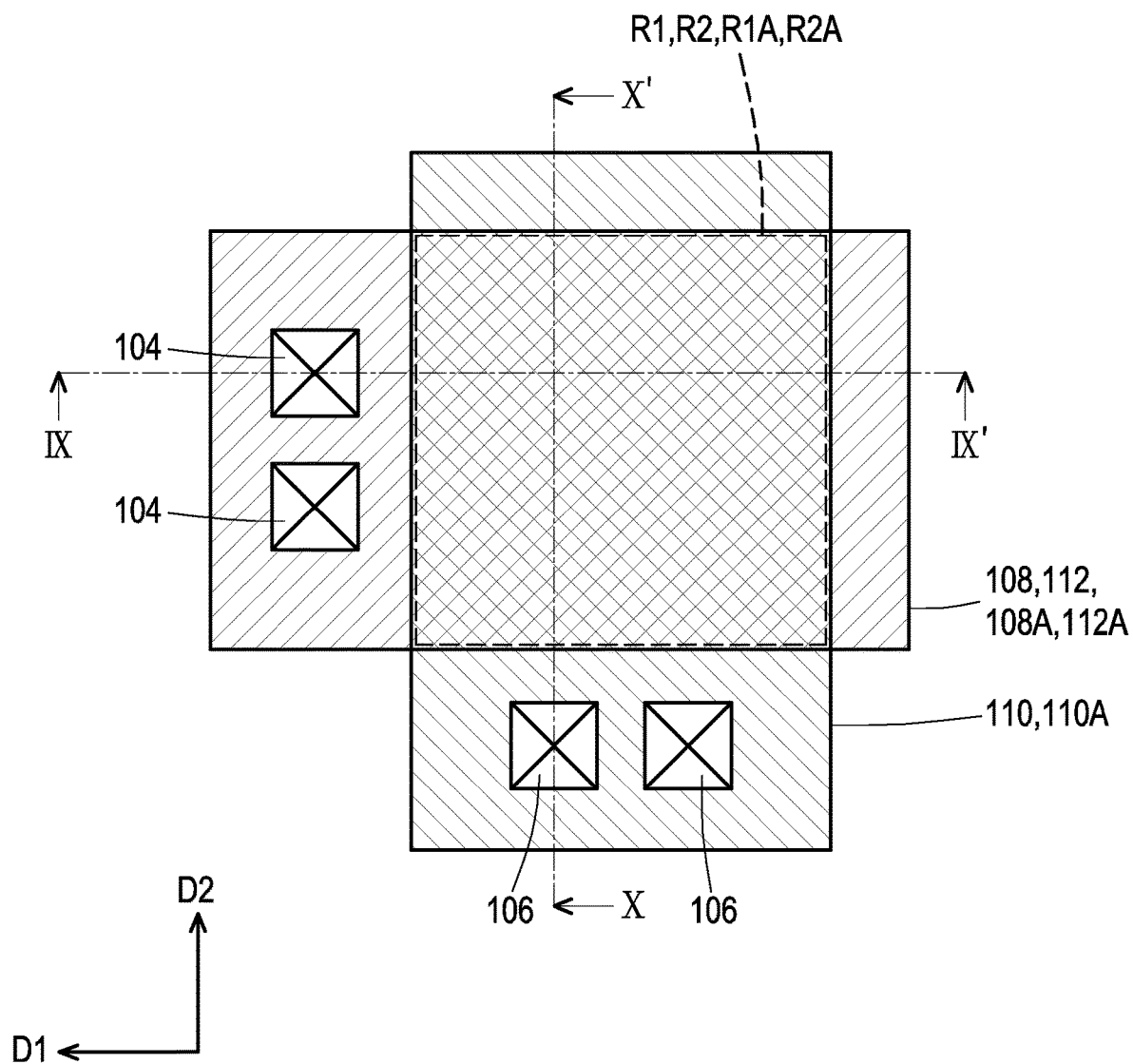
FIG. 11 is a top view of some components in the semiconductor structure of FIG. 10.

FIG. 10 is a cross-sectional view of a semiconductor structure according to other embodiments of the invention. FIG. 11 is a top view of some components in the semiconductor structure of FIG. 10. FIG. 10 is a cross-sectional view taken along section line IX-IX' and section line X-X' in FIG. 11.

Referring to FIG. 1, FIG. 2, FIG. 10, and FIG. 11, the difference between the semiconductor structure 50 of FIG. 10 and the semiconductor structure 10 of FIG. 1 is as follows. The semiconductor structure 50 may further include a capacitor structure 102A. The capacitor structure 102A is disposed above the capacitor structure 102. In some embodiments, the capacitor structure 102 and the capacitor structure 102A may be disposed in different dielectric layers. For example, the capacitor structure 102 may be disposed in the dielectric layer 130, and the capacitor structure 102A may be disposed in the dielectric layer 132.

The capacitor structure 102A includes an electrode layer 108A, an electrode layer 110A, an electrode layer 112A, a dielectric layer 114A, and a dielectric layer 116A. The top-view pattern of the electrode layer 110A partially overlaps the top-view pattern of the electrode layer 108A to have an overlapping region R1A. The top-view pattern of the electrode layer 112A partially overlaps the top-view pattern of the electrode layer 110A to have an overlapping region R2A. The overlapping region R1, the overlapping region R2, the overlapping region R1A, and the overlapping region R2A may have the same top-view area. In addition, in the capacitor structure 102 and the capacitor structure 102A, similar components are denoted by similar reference symbols, and the description thereof is omitted. That is, the details (e.g., material and arrangement) of each component in the capacitor structure 102A may refer to the description of the capacitor structure 102 in the above embodiments. Moreover, the number, shape and/or size of the electrode layers in the capacitor structure 102 may be the same as or different from the number, shape and/or size of the electrode layers in the capacitor structure 102A.

The contact structure 104 is electrically connected to the electrode layer 108, the electrode layer 112, the electrode layer 108A, and the electrode layer 112A. The top-view pattern of the contact structure 104 is located outside the overlapping region R1, outside the overlapping region R2, outside the overlapping region R1A, and outside the overlapping region R2A. In some embodiments, the contact structure 104 may be directly connected to the electrode layer 108, the electrode layer 112, the electrode layer 108A, and the electrode layer 112A.

The contact structure 106 is electrically connected to the electrode layer 110 and the electrode layer 110A. The top-view pattern of the contact structure 106 is located outside the overlapping region R1, outside the overlapping region R2, outside the overlapping region R1A, and outside the overlapping region R2A. In some embodiments, the contact structure 106 may be directly connected to the electrode layer 110 and the electrode layer 110A.

The semiconductor structure 50 may further include a capping layer 150A. The capping layer 150A is disposed on the capacitor structure 102A and is disposed in the dielectric structure 126. In some embodiments, the material of the capping layer 150A is, for example, a dielectric material such as silicon nitride.

In addition, in the semiconductor structure 10 of FIG. 1 and the semiconductor structure 50 of FIG. 10, the same components are denoted by the same reference symbols, and the description thereof is omitted.

Based on the above embodiments, in the semiconductor structure 50, the top-view pattern of the electrode layer 110 partially overlaps the top-view pattern of the electrode layer 108 to have the overlapping region R1. The top-view pattern of the electrode layer 112 partially overlaps the top-view pattern of the electrode layer 110 to have the overlapping region R2. The overlapping region R1 and the overlapping region R2 have the same top-view area. Therefore, the capacitor formed by the electrode layer 108, the dielectric layer 114, and the electrode layer 110 and the capacitor formed by the electrode layer 110, the dielectric layer 116, and the electrode layer 112 can have the same capacitance. In this way, the capacitance of the capacitor structure 102 can be increased, and the design of the capacitor structure 102 is easier.

In addition, in the semiconductor structure 50, the top-view pattern of the electrode layer 110A partially overlaps the top-view pattern of the electrode layer 108A to have the overlapping region R1A. The top-view pattern of the electrode layer 112A partially overlaps the top-view pattern of the electrode layer 110A to have the overlapping region R2A. The overlapping region R1A and the overlapping region R2A have the same top-view area. Therefore, the capacitor formed by the electrode layer 108A, the dielectric layer 114A, and the electrode layer 110A and the capacitor formed by the electrode layer 110A, the dielectric layer 116A, and the electrode layer 112A can have the same capacitance. In this way, the capacitance of the capacitor structure 102A can be increased, and the design of the capacitor structure 102A is easier.

In summary, in the semiconductor structure of the aforementioned embodiments, a first capacitor structure includes a first electrode layer, a second electrode layer, a third electrode layer, a first dielectric layer, and a second dielectric layer. The top-view pattern of the second electrode layer partially overlaps the top-view pattern of the first electrode layer to have a first overlapping region. The top-view pattern of the third electrode layer partially overlaps the top-view pattern of the second electrode layer to have a second overlapping region. The first overlapping region and the second overlapping region have the same top-view area. Therefore, the capacitor formed by the first electrode layer, the first dielectric layer, and the second electrode layer and the capacitor formed by the second electrode layer, the second dielectric layer, and the third electrode layer can have the same capacitance. In this way, the capacitance of the capacitor structure can be increased, and the design of the capacitor structure is easier.

Although the invention has been described with reference to the above embodiments, it will be apparent to one of ordinary skill in the art that modifications to the described embodiments may be made without departing from the spirit of the invention. Accordingly, the scope of the invention is defined by the attached claims not by the above detailed descriptions.

What is claimed is:

1. A semiconductor structure, comprising:
    a substrate;
    a first capacitor structure disposed above the substrate and comprising:
        a first electrode layer;
        a second electrode layer disposed on the first electrode layer, wherein a top-view pattern of the second electrode layer partially overlaps a top-view pattern of the first electrode layer to have a first overlapping region;
        a third electrode layer disposed on the second electrode layer, wherein a top-view pattern of the third electrode layer partially overlaps the top-view pattern of the second electrode layer to have a second overlapping region, wherein the first overlapping region and the second overlapping region have the same top-view area;
        a first dielectric layer disposed between the first electrode layer and the second electrode layer; and
        a second dielectric layer disposed between the second electrode layer and the third electrode layer;
    a first contact structure electrically connected to the first electrode layer and the third electrode layer, wherein a top-view pattern of the first contact structure is located outside the first overlapping region and outside the second overlapping region; and
    a second contact structure electrically connected to the second electrode layer, wherein a top-view pattern of the second contact structure is located outside the first overlapping region and outside the second overlapping region.

2. The semiconductor structure according to claim 1, wherein
    the top-view pattern of the first electrode layer and the top-view pattern of the third electrode layer extend in a first direction,
    the top-view pattern of the second electrode layer extends in a second direction, and
    the first direction intersects the second direction.

3. The semiconductor structure according to claim 2, wherein the first direction is perpendicular to the second direction.

4. The semiconductor structure according to claim 1, wherein the top-view pattern of the first electrode layer and the top-view pattern of the third electrode layer have the same shape and the same size.

5. The semiconductor structure according to claim 1, wherein the top-view pattern of the first electrode layer, the top-view pattern of the second electrode layer, and the top-view pattern of the third electrode layer have the same shape and the same size.

6. The semiconductor structure according to claim 1, wherein a contour of the top-view pattern of the second electrode layer rotated by 90 degrees completely overlaps a contour of the top-view pattern of the first electrode layer and a contour of the top-view pattern of the third electrode layer.

7. The semiconductor structure according to claim 1, wherein the top-view pattern of the first electrode layer, the top-view pattern of the second electrode layer, and the top-view pattern of the third electrode layer comprise rectangles.

8. The semiconductor structure according to claim 1, wherein
    the first contact structure is directly connected to the first electrode layer and the third electrode layer, and
    the second contact structure is directly connected to the second electrode layer.

9. The semiconductor structure according to claim 1, wherein
    the third electrode layer is directly connected to the first electrode layer,
    the first contact structure is directly connected to the first electrode layer, and
    the second contact structure is directly connected to the second electrode layer.

10. The semiconductor structure according to claim 1, wherein the first capacitor structure further comprises:
    a fourth electrode layer disposed on the third electrode layer, wherein a top-view pattern of the fourth electrode layer partially overlaps the top-view pattern of the third electrode layer to have a third overlapping region, wherein the first overlapping region, the second overlapping region, and the third overlapping region have the same top-view area; and
    a third dielectric layer disposed between the third electrode layer and the fourth electrode layer, wherein
    the top-view pattern of the first contact structure is located outside the first overlapping region, outside the second overlapping region, and outside the third overlapping region,
    the second contact structure is electrically connected to the second electrode layer and the fourth electrode layer, and
    the top-view pattern of the second contact structure is located outside the first overlapping region, outside the second overlapping region, and outside the third overlapping region.

11. The semiconductor structure according to claim 10, wherein the top-view pattern of the second electrode layer and the top-view pattern of the fourth electrode layer have the same shape and the same size.

12. The semiconductor structure according to claim 1, further comprising:
    a second capacitor structure disposed above the first capacitor structure and comprising:
        a fourth electrode layer;
        a fifth electrode layer disposed on the fourth electrode layer, wherein a top-view pattern of the fifth electrode layer partially overlaps a top-view pattern of the fourth electrode layer to have a third overlapping region;

a sixth electrode layer disposed on the fifth electrode layer, wherein a top-view pattern of the sixth electrode layer partially overlaps the top-view pattern of the fifth electrode layer to have a fourth overlapping region, wherein the first overlapping region, the second overlapping region, the third overlapping region, and the fourth overlapping region have the same top-view area;

a third dielectric layer disposed between the fourth electrode layer and the fifth electrode layer; and a fourth dielectric layer disposed between the fifth electrode layer and the sixth electrode layer, wherein the first contact structure is electrically connected to the first electrode layer, the third electrode layer, the fourth electrode layer, and the sixth electrode layer, the top-view pattern of the first contact structure is located outside the first overlapping region, outside the second overlapping region, outside the third overlapping region, and outside the fourth overlapping region, the second contact structure is electrically connected to the second electrode layer and the fifth electrode layer, and the top-view pattern of the second contact structure is located outside the first overlapping region, outside the second overlapping region, outside the third overlapping region, and outside the fourth overlapping region.

13. The semiconductor structure according to claim 12, wherein the first capacitor structure and the second capacitor structure are disposed in different dielectric layers.

14. The semiconductor structure according to claim 1, further comprising:

a dielectric structure disposed on the substrate, wherein the first capacitor structure is disposed in the dielectric structure.

15. The semiconductor structure according to claim 14, wherein the dielectric structure comprises:

a third dielectric layer disposed on the substrate;

a fourth dielectric layer disposed on the third dielectric layer; and a fifth dielectric layer disposed on the fourth dielectric layer, and the semiconductor structure further comprises:

a first interconnect structure disposed in the third dielectric layer; and a second interconnect structure disposed in the fourth dielectric layer and the fifth dielectric layer and disposed on the first interconnect structure, wherein the second interconnect structure is electrically connected to the first interconnect structure.

16. The semiconductor structure according to claim 15, wherein the first capacitor structure is disposed in the fourth dielectric layer or the fifth dielectric layer.

17. The semiconductor structure according to claim 15, wherein the first contact structure and the second contact structure are disposed in the fourth dielectric layer and the fifth dielectric layer.

18. The semiconductor structure according to claim 15, wherein the first contact structure and the second contact structure are disposed in the third dielectric layer.

19. The semiconductor structure according to claim 15, wherein the dielectric structure further comprises:

a capping layer disposed between the third dielectric layer and the fourth dielectric layer; and a stop layer disposed between the fourth dielectric layer and the fifth dielectric layer.

20. The semiconductor structure according to claim 19, wherein the first capacitor structure is disposed between the stop layer and the capping layer.

* * * * *